United States Patent [19]

Leung et al.

[11] Patent Number: 4,693,781
[45] Date of Patent: Sep. 15, 1987

[54] TRENCH FORMATION PROCESS

[75] Inventors: Howard K. H. Leung; Bich-Yen Nguyen; John R. Alvis, all of Austin; John Schmiesing, Round Rock, all of Tex.

[73] Assignee: Motorola, Inc., Schaumburg, Ill.

[21] Appl. No.: 878,769

[22] Filed: Jun. 26, 1986

[51] Int. Cl.⁴ .......................................... H01L 21/308
[52] U.S. Cl. .................................... 156/643; 156/657; 156/659.1
[58] Field of Search ............... 156/628, 643, 655, 657, 156/659.1; 29/576 E, 576 W; 427/93

[56] References Cited

FOREIGN PATENT DOCUMENTS 57-186339  11/1982  Japan ................................... 156/628
58-168261  10/1983  Japan ................................. 29/576 W
59-57449    4/1984  Japan ................................. 29/576 W

OTHER PUBLICATIONS

J. M. Blum et al., "Method for Making Three-Dimensional Microstructures in Silicon, Particularly a Buried Oxide Structure for Bipolar Integrated Circuits", IBM Technical Disclosure Bulletin, vol. 21, No. 9, 2/1979.

Primary Examiner—Kenneth M. Schor
Attorney, Agent, or Firm—John A. Fisher; Jeffrey Van Myers

[57] ABSTRACT

A process is disclosed for fabricating a semiconductor device which includes a trench formed at the surface of the device substrate. The surface of the device substrate is oxidized and the oxide is patterned to form an opening which exposes a portion of the underlying surface. Ions are implanted through the opening and into the surface to form a damaged surface region which is coincident with the opening and extends under the edge of the oxide. A trench is etched by reactive ion etching using the opening in the oxide as an etch mask. The substrate, including the walls of the trench and the ion implant damaged surface portion under the edge of the oxide, is thermally oxidized. The oxidation rate is enhanced by the damage and causes a thicker oxide to grow in the damaged region which forms a collar around the intersection of the trench with the surface. Upon removing the oxide, the intersection of the trench with the surface is characterized by a rounded corner caused by the enhanced oxidation in that location during the oxidation.

14 Claims, 8 Drawing Figures

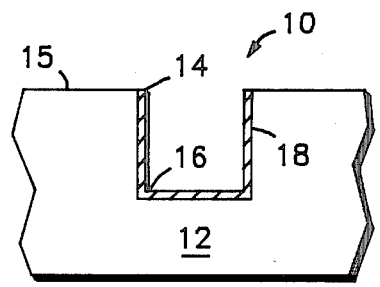
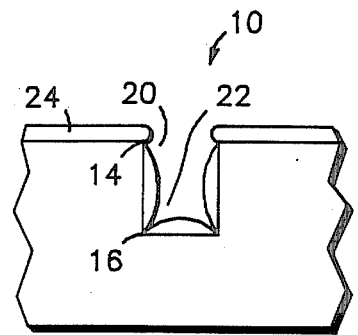
FIG. 1
—PRIOR ART—
FIG. 2
—PRIOR ART—
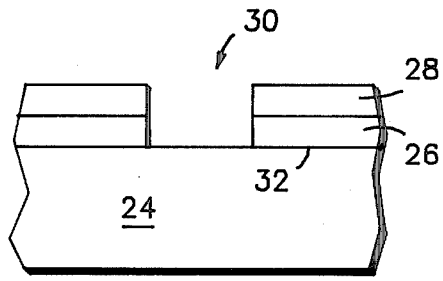
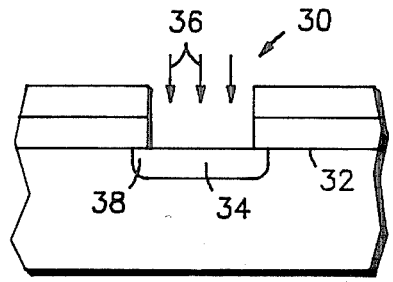
FIG. 3
FIG. 4
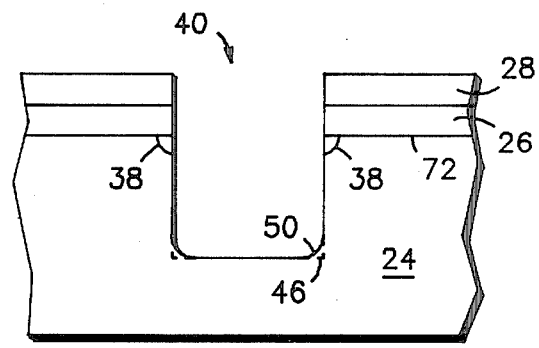
FIG. 5

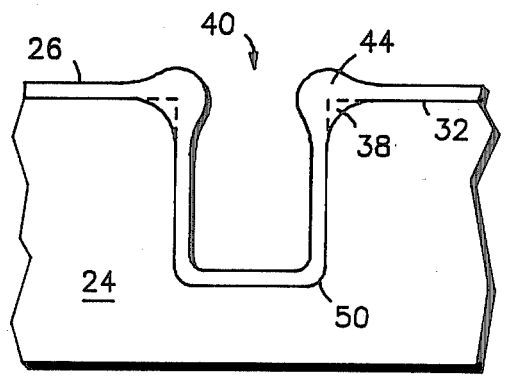
FIG. 6
FIG. 7
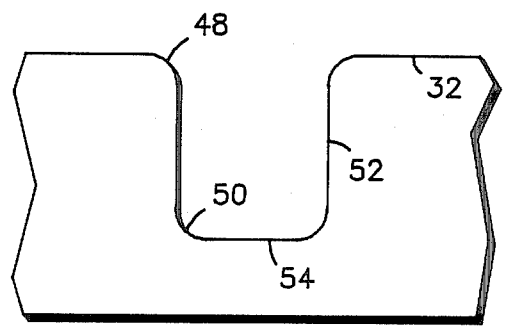
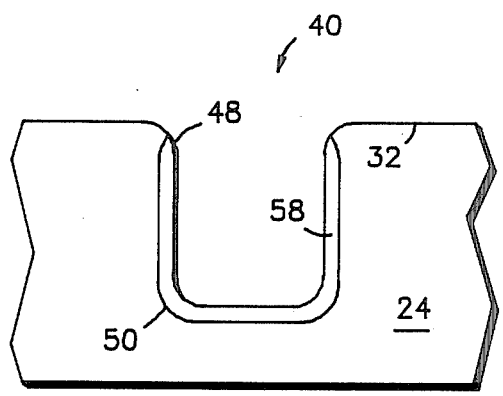
FIG. 8

TRENCH FORMATION PROCESS

BACKGROUND OF THE INVENTION

This invention relates generally to a method for manufacturing a semiconductor device, and more particularly to a process for manufacturing a semiconductor device including a trench extending into the device substrate from the surface.

Semiconductor integrated circuit devices are becoming increasingly complex, incorporating more components having a smaller feature size and greater packing density. To maximize the size of an individual circuit component while minimizing the amount of surface area which the component occupies on the chip surface, some components are being implemented as vertical structures extending into the device substrate rather than as conventional horizontal structures. One way to maximize component size in this manner, for example, is to form a trench in the device substrate extending into the substrate from the substrate surface. Individual components are then fabricated on the vertical walls of the trench or the trench is properly refilled to form a device component. In this manner, trench capacitors and vertical resistors as well as vertical transistors can be fabricated. A trench capacitor, either PN junction or MOS, maximizes the size of the capacitor by having the PN junction or MOS interface positioned along the vertical trench wall rather than spread out across the surface of the semiconductor substrate. In fact, all of the walls of the trench, both side and bottom, contribute to the area of the capacitor.

Isolation between two adjacent components of the integrated circuit can be achieved with the use of minimum surface area by etching a narrow trench extending into the substrate between the two components and then refilling the trench with an insulator. Trench isolation uses much less surface area than does either diffused junction isolation or oxide isolation of the localized oxidation variety.

High quality, high integrity devices require the semiconductor material along the edge of the trench to be of high quality with a minimum of process induced defects. Reactive ion etching, which is a preferred method for anisotropically etching narrow, deep trenches, has a tendency to produce a thin defect layer along the trench walls. Defects of this type lower device yield and degrade device performance because they provide recombination sites which increase leakage currents. If the trench is used to form a trench capacitor, for example, the increased leakage currents cause the loss of information stored dynamically on the PN junction capacitor. Further, the defect level can result in emitter-collector leakage or shorts if the trench is used for isolation between bipolar transistors and the emitter junction is positioned to abut the trench isolation.

The presence of a trench in a semiconductor substrate adds to the difficulties of processing an integrated circuit device. The existence of a sharp corner where the trench intersects the surface of the semiconductor substrate leads to difficulties in filling the trench or in providing a conductive lead which passes over the corner from the substrate surface to the trench. Deposition in the vicinity of the corner is nonuniform and may even be discontinuous. The nonuniform deposition, which is directly related to the "sharpness" of the corner which the deposited material must traverse, can result in yield loss or can compromise long term reliability.

In view of the foregoing difficulties, it is apparent that a need existed for a process which would provide a trench in a semiconductor substrate in which the walls of the trench are relatively defect free and the corners are gently rounded.

It is therefore an object of this invention to provide an improved process for forming trenches in a semiconductor substrate.

It is another object of this invention to provide an improved process for forming semiconductor devices.

BRIEF SUMMARY OF THE INVENTION

The foregoing and other objects and advantages are achieved, in accordance with the invention, by a process which rounds the corners of a trench formed in a semiconductor substrate and which removes a defective layer from the trench walls. In one embodiment of the invention a semiconductor device structure is fabricted by forming a patterned mask overlying a surface of a semiconductor substrate. The patterned mask is provided with an opening which exposes a portion of the underlying semiconductor surface. The crystal structure in the exposed portion of the surface is damaged, forming a shallow damaged region. A trench is anisotropically etched in the substrate using the patterned mask as an etch mask. Following the anisotropic etching, the substrate, including the walls of the trench, are thermally oxidized. The thermal oxidation is enhanced by the presence of crystalline damage in the exposed semiconductor material. The enhanced oxidation causes the growth of a thicker oxide, with the concomitant consumption of an increased amount of silicon from the damaged region.

BRIEF DESCRIPTION OF THE DRAWINGS

FIGS. 1 and 2 illustrate problems encountered with prior art processes and structures; and FIGS. 3-8 illustrate steps in a process in accordance with the invention.

DETAILED DESCRIPTION OF PREFERRED EMBODIMENTS

FIG. 1 schematically depicts, in cross section, a portion of a semiconductor device and illustrates problems encountered with a trench 10 formed in semiconductor substrate 12. Fabrication by the prior art processes results in a sharp corner 14 where the top of trench 10 intersects surface 15 of the semiconductor substrate. Another sharp corner 16 occurs at the bottom of the trench. In addition, forming the trench by reactive ion etching causes the formation of a shallow damaged region 18 lining the walls and bottom of the trench. As explained before, the damaged region can result in excessive leakage current in devices formed adjacent the trench.

In FIG. 2, problems associated with depositing a subsequent layer of material 24 on a substrate including a trench having sharp corners 14 and 16 is illustrated. In the deposition of the material by chemical vapor deposition, for example, the kinetics of the reactant gas flow result in a starved condition near the sharp corners. This, in turn, results in a cusping 20, 22 at the top and bottom of the trench. Continuity of layer 24 from top to bottom of the trench or across the trench is difficult to achieve. Continued deposition of a layer of material such as 24 to completely fill trench 20 can result in voids in the vicinity of the cusps.

The foregoing problems are overcome by a process in accordance with the invention, one embodiment of which is illustrated schematically in cross section in FIGS. 3-8. FIG. 3 illustrates a semiconductor substrate 24 such as a silicon substrate upon which has been formed a dielectric layer 26 and a resist masking layer 28. Layer 26, for example, can be silicon dioxide, resist layer 28 can be one of the conventional photoresists used in the semiconductor industry and substrate 24 is selected and processed depending on the type of semiconductor device being processed. In conventional manner, resist layer 28 is lithographically patterned to form a mask having a preferred pattern of openings 30 therein. The patterned mask is then used to etch a similar pattern of openings 30 through layer 26 to expose a portion of the surface 32 of silicon wafer 24. Although illustrated here as a single opening 30, the pattern formed in layers 28 and 26 can be any pattern necessary for the fabrication of the desired semiconductor device.

In accordance with the invention, dielectric layer 26 and resist layer 28 are used as a mask in a process step which selectively damages that portion of surface 32 which is exposed through opening 30. A region 34 of damaged silicon is formed, for example, by ion implantation. A beam of ions, indicated by arrows 36, such as germanium, silicon, boron trifluoride, phosphorus, or other relatively heavy ion is implanted into the exposed surface. The relatively heavy ions are effective in causing lattice damage in the exposed silicon. Very importantly, because of lattice scattering, the damaged silicon layer extends laterally into a region 38 which is underneath masking layers 26, 28. Alternatively the region 38 can be formed by a high concentration diffusion, or the like.

As illustrated in FIG. 5, a trench 40 is anisotropically etched into surface 32 of semiconductor substrate 24 using the opening in the masking layers 26, 28 as an etch mask. Preferably, the anisotropic etching is done by reactive ion etching, but the trench can also be formed by ion milling, reactive ion beam etching, anisotrophic plasma etching, or anisotropic wet chemical etching. By anisotropically etching trench 40 using the opening in masking layers 26, 28, damaged region 38 which extended laterally beneath oxide layer 26 is not etched. Damaged region 38 thus forms a self-aligned collar extending around trench 40 at the intersection of the trench with surface 32. In addition, and not shown in this Figure, the reactive ion etch or other etch process leaves a shallow damaged skin bounding the walls of the trench. This damaged skin, consisting of lattice defects, might prove deleterious to device characteristics if not removed or otherwise treated. Corners at 46 are rounded because of differential etch rates due to reactive species concentration gradients into the corner 46, thereby producing rounded corners 50.

After the formation of the trench, a sacrificial oxide is thermally grown on the surface of semiconductor substrate 24 and on the walls of trench 40 as illustrated in FIG. 6. Photoresist layer 28 is removed prior to the thermal oxidation and, in accordance with the illustrated embodiment of the invention, oxide layer 26 is also removed before the thermal oxide growth. The presence of damaged silicon regions 38 at the intersection of trench 40 with surface 32, causes enhanced thermal oxidation in these regions. The result of the enhanced oxidation is shown, in exaggerated form, by the oxide protuberance 44 formed about the top of trench 40. In this figure the resultant oxide 44 is shown superimposed upon the original silicon substrate profile. As is well known, the growth of silicon dioxide by thermal oxidation of a silicon substrate results in the chemical combination of one silicon atom with two oxygen atoms. The resultant oxide layer is formed over the silicon substrate with about 40% of its thickness extending below the original silicon surface. The enhanced oxidation in the damaged regions results in an increased consumption of silicon at the corner at the top of the trench. In other words, damaged region 38 is consumed by oxide 44.

Following the growth of thermal oxide 44, the oxide is etched away in either a wet chemical etchant such as a dilute solution of hydrofluoric acid or in a plasma etchant such as a mixture of carbon tetrafluoride and oxygen. The removal of the oxide layer (and hence the designation "sacrificial oxide") results in a trench structure as illustrated in FIG. 7. The enhanced oxidation of the damage regions 38 and thus the increased consumption of silicon in these regions results in a rounding of corners 48 surrounding the intersection of the trench with surface 32. Additionally, the oxidation consumes the shallow damaged region along the walls of the trench. The resultant trench, therefore, is characterized by gently rounded corners 48 and 50 and damage free walls 52, 54.

FIG. 8 illustrates a further step in an alternative embodiment of the invention to form a circuit component utilizing the etched trench. An oxide layer or other masking layer, such as an oxide/nitride combination, is formed over surface 32 and is patterned to expose the opening of trench 40. Before sacrificial oxide layer 44 is removed, dopant impurity is diffused into the walls of trench 40 to form a doped region 58. If substrate 24 is of P-type conductivity, for example, diffused region 58 can be doped with arsenic or phosphorus to form an N-type region. Region 58 then forms a PN junction with substrate 24. Electrical contact to doped region 58 and to substrate 24 are made in the conventional manner with a metal such as aluminum, doped polycrystalline silicon, or the like. The electrical contact to doped region 58 can be easily fabricated because the rounded corners 48 and 50 are easily and uniformly covered by a deposited layer. The capacitance of the PN junction formed between regions 58 and 24 can be used as a circuit component in an integrated device such as a dynamic RAM. The size of the capacitor is determined by the area of the PN junction. The PN junction formed along the walls of trench 40 is considerably larger than the area of a horizontal PN junction which could be formed at the surface of substrate 24 and which would occupy the same surface area as does trench 40.

Thus it is apparent that there has been provided, in accordance with the invention, a process for fabricating a semiconductor device structure which fully meets the objects and advantages set forth above. Although the invention has been described and illustrated with reference to specific embodiment thereof, it is not intended that the invention be limited to these illustrative embodiments. Those skilled in the art will recognize, after review of the foregoing detailed description, that variations and modifications can be made without departing from the spirit of the invention. For example, other masking material can be utilized, other surface damaging mechanisms can be employed, and other anisotropic etchants can be used. Accordingly, it is intended to include all such variations and modifications as fall within the scope of the appended claims.

We claim:

1. A process for fabricating a semiconductor device which comprises the steps of: providing a silicon substrate having a surface; forming a first oxide layer overlying said surface; patterning said first oxide to form an opening exposing a portion of said surface; implanting ions through said opening and into said surface to form a damaged surface region coincident with said opening and extending under said first oxide surrounding said opening; reactive ion etching said substrate exposed through said opening to form a trench extending into said substrate from said surface and extending below the damaged surface region; heating said substrate to grow a thermal second oxide on the walls of said trench and on said portion of said damaged surface region extending under said first oxide; and removing said thermal second oxide.

2. The process of claim 1 wherein in said step of implanting ions, an ion species is selected from the group consisting of silicon, germanium, boron trifluoride, phosphorus, and argon.

3. The process of claim 1 wherein the step of patterning said first oxide comprises forming a patterned resist layer overlying said first oxide and etching said first oxide using said resist layer as an etch mask.

4. The process of claim 3 wherein said patterned resist layer is retained and used as a mask for said steps of implanting ions and reactive ion etching.

5. The process of claim 1 further comprising the step of removing said first oxide after said step of heating.

6. A process for fabricating a trench in a semiconductor substrate which comprises the steps of: providing a semiconductor substrate; forming an insulating layer overlying a surface of said substrate; patterning said insulating layer to form an opening therethrough exposing a portion of said surface; implanting ions through said opening and into said portion of said surface to form an implant damaged region, said damaged region extending laterally beneath said insulating layer around said opening; anisotropically etching said substrate exposed through said opening to form a trench extending into said substrate from said surface and through said implant damaged region and below it; oxidizing said substrate to form an oxide on the walls of said trench and on the portion of said damaged region extending laterally beneath said insulating layer; and subsequently removing said oxide.

7. The process of claim 6 wherein said step of anisotropically etching comprises reactive ion etching.

8. The process of claim 6 wherein said insulating layer comprises silicon dioxide.

9. The process of claim 8 wherein said silicon dioxide is removed after said step of oxidizing said substrate.

10. A process for fabricating a semiconductor device structure which comprises the steps of: providing a semiconductor substrate; forming a patterned mask overlying a surface of said substrate and having an opening therethrough exposing a portion of said surface; lattice damaging said portion of said surface exposed through said patterned mask; anisotropically etching a trench extending into said substrate and though said damaged portion and below it using said patterned mask as an etch mask; oxidizing said substrate including edges of said trench and the remaining damaged portion of said surface; and removing the oxide formed in said step of oxidizing said substrate.

11. The process of claim 10 wherein said step of damaging comprises implanting ions into said portion of said surface.

12. The process of claim 10 wherein said damaged portion of said surface extends laterally beyond the extent of said opening to include a second portion of said surface positioned beneath said patterned mask.

13. The process of claim 10 wherein said step of anisotropically etching comprises reactive ion etching.

14. The process of claim 10 wherein said step of anisotropically etching comprises ion milling.

* * * * *